United States Patent
Adan (10) Patent No.: US 7,453,124 B2
(45) Date of Patent: Nov. 18, 2008

(54) FIELD EFFECT TRANSISTOR AND FABRICATION METHOD THEREOF

(75) Inventor: Alberto O Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/157,077

(22) Filed: Jun. 21, 2005

(65) Prior Publication Data

US 2005/0282342 A1    Dec. 22, 2005

(30) Foreign Application Priority Data

Jun. 22, 2004    (JP)    ............... 2004-184182

(51) Int. Cl.
H01L 27/88    (2006.01)
(52) U.S. Cl. ............................ 257/365; 257/401
(58) Field of Classification Search ................ 257/401, 257/365, 213
See application file for complete search history.

(56) References Cited

U.S. PATENT DOCUMENTS

| | | | | |
|---|---|---|---|---|
| 5,844,278 | A * | 12/1998 | Mizuno et al. | 257/345 |
| 5,897,351 | A * | 4/1999 | Forbes | 438/242 |
| 6,432,829 | B2 | 8/2002 | Muller et al. | |
| 6,525,403 | B2 * | 2/2003 | Inaba et al. | 257/618 |
| 7,122,871 | B2 * | 10/2006 | Lee et al. | 257/412 |
| 7,148,541 | B2 * | 12/2006 | Park et al. | 257/347 |
| 2002/0011612 | A1 | 1/2002 | Hieda | |
| 2004/0094807 | A1 * | 5/2004 | Chau et al. | 257/401 |

FOREIGN PATENT DOCUMENTS

| | | |
|---|---|---|
| JP | 2002-110963 | 4/2002 |
| JP | 2002-118255 | 4/2002 |
| KR | 10-2003-0065631 | 8/2003 |

OTHER PUBLICATIONS

H.S.P. Wong, "Beyond the conventional Transistor" IBM Journal of Research and Development, vol. 46, No. 2/3, Mar./May 2002, pp. 133-168.
Hisamoto et al., "FinFET-A Self-Aligned Double-Gate MOSFET Scalable to 20nm", IEEE Transactions on Electron Devices, vol. 47, No. 12 Dec. 2000, pp. 2320-2325.
B. Doyle et al., "Tri-Gate Fully-Depleted CMOS Transistors" Fabrication, Design and Layout, 2003 Symposium on VLSI Technology Digest of Technical Papers, 2 pages.
T. Parke et al., "Fabrication of body-Tied FinFETs (Omega MOSFETs) Using BulkSi Wafers", 2003 Symposium on VLSI Technology Digest Of Technical Papers, 2 pages.
Tang, S.H. et al., "Solid-State Circuits Conference", Digest of Technical Papers, ISSCC, IEEE International, 2001, pp. 118-119, 437.

* cited by examiner

*Primary Examiner*—Michael Trinh
(74) *Attorney, Agent, or Firm*—Harness, Dickey & Pierce, P.L.C.

(57) ABSTRACT

A field effect transistor of the present invention includes, on a semiconductor substrate, (i) a fin section formed in a fin shape protruding from the substrate, (ii) a gate dielectric for covering a channel region section of the fin section, (iii) a gate electrode that is insulated from the channel region section by the gate dielectric and is formed on the channel region section and (iv) an insulating layer for covering a surface of the semiconductor substrate. The fin section is formed so as to extend from the semiconductor substrate through the insulating layer and protrudes outward from a surface of the insulating layer. In this way, the channel region of the fin section is physically in contact with the substrate.

22 Claims, 8 Drawing Sheets

FIELD EFFECT TRANSISTOR AND FABRICATION METHOD THEREOF

This Nonprovisional application claims priority under 35 U.S.C. § 119(a) on Patent Application No. 184182/2004 filed in Japan on Jun. 22nd, 2004, the entire contents of which are hereby incorporated by reference.

FIELD OF THE INVENTION

The present invention relates to a process and a fabrication method of a semiconductor device. The present invention, specifically, relates to a fin Field Effect Transistor (FET) formed on a bulk Si wafer and a fabrication method thereof. The fin FET formed on the bulk Si wafer is applicable for realization of a highly integrated circuit.

BACKGROUND OF THE INVENTION

An integrated circuit tends to be more highly integrated. Accordingly, a scaling technique for a CMOSFET (Complementary Metal Oxide Semiconductor FET) used for the integrated circuit is widely known. The scaling is an industrial method for size reduction and performance improvement.

However, the following technical problems arise in the scaling. That is, the scaling (reduction of channel length, reduction of gate dielectric thickness and increase in impurity doping concentration) is accompanied by difficulty in controlling a short channel effect (SCE) and an off-state leakage current of a MOSFET.

Figure 9:
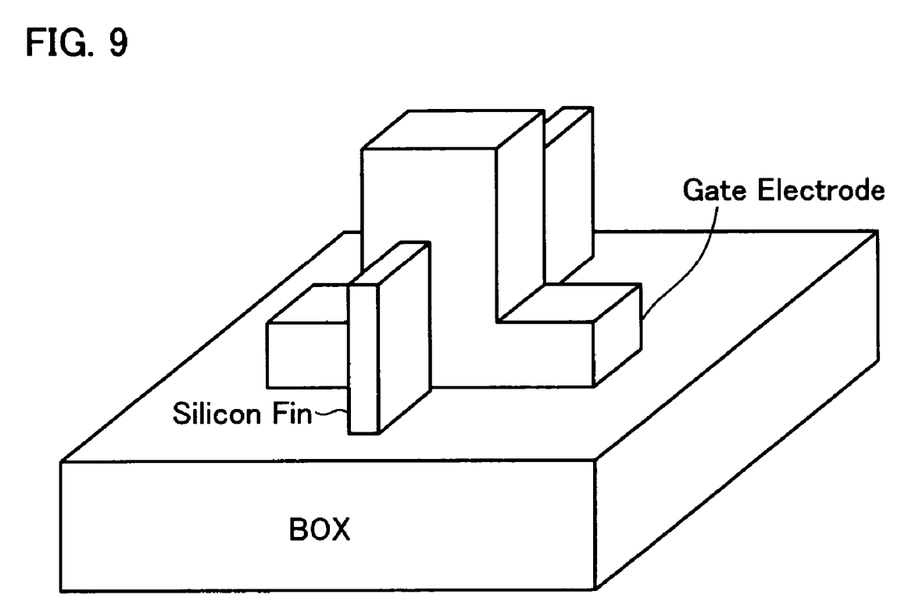
FIG. 9 is a perspective view of a fin FET formed on an SOI wafer of conventional art.

In order to solve these problems, a MOSFET fabricated on Silicon-On-Insulator (SOI) substrate (a crystalline silicon substrate formed on an insulator film) has been developed. The SOI can reduce junction parasitic capacitance and the leakage current. Further, in order to solve the problems mentioned above, a Double-Gate MOSFET has been developed. One of practical embodiments of the Double-Gate MOSFET is a fin FET as described in each of Non-Patent Document 1 and Non-Patent Document 2. The fin FET is formed on the SOI substrate. Due to the very thin thickness, as illustrated in FIG. 9, of a body constituting a channel region, the fin FET operates in a fully depleted mode.

As another example of a solution for solving the problems, there is a Tri-Gate FET (Non-Patent Document 3). This Tri-Gate FET is also fabricated on the SOI substrate. Further, recently a fin FET formed on the bulk Si wafer substrate has been proposed (Non-Patent Document 4).

A fin structure disclosed in Patent Document 1 is formed by epitaxy. A fin structure disclosed in Patent Document 2 is also formed by epitaxy. In this case, an active area, where epitaxial growth occurs, is formed by a patterned layer (121) having the same thickness as epitaxial layer thickness.

[Patent Document 1]
Japanese Laid-Open Patent Application (Tokukai 2002-110963 (published on Apr. 12, 2002); corresponding to U.S. Pat. No. 6,525,403 B2)

[Patent Document 2]
Japanese Laid-Open Patent Application (Tokukai 2002-118255 (published on Apr. 19, 2002); corresponding to U.S. Patent Application Publication No. 2002/0011612 A1)

[Non-Patent Document 1]
IBM Journal of Research and Development, Vol. 46, No. 2/3, March/May 2002

[Non-Patent Document 2]
Hisamoto et al., FinFET-a Self-Aligned Double-Gate MOSFET Scalable to 20 nm, IEEE Trans. Vol. 47 (2000) 2320

[Non-Patent Document 3]
B. Doyle et al., "Tri-Gate Fully-Depleted CMOS Transistors: Fabrication, Design and Layout," 2003 Symp. VLSI Tech. Digest

[Non-Patent Document 4]
T. Park et al., "Fabrication of Body-Tied FinFETs(Omega MOSFETs), using BulkSi wafers," 2003 Symp. VLSI Tech. Digest The conventional fin FET formed on the SOI has a problem in that, in the view of IC production, the conventional fin FET is costly because the SOI wafer is more expensive than the bulk Si wafer generally used in IC fabrication. Further, the process of the fin FET formed on the SOI is so complex that a device size can be less freely chosen. Furthermore, a thicker fin results in a partially depleted device. This partially depleted device tends to cause such a problem that operation of a transistor becomes destabilized due to floating body effects, in which a body potential of a channel region section floats apart from a fixed potential such as earth and the like.

In order to solve the problem, fin FET fabrication on the bulk Si wafer is expected. Non-Patent Document 4 discloses the fin FET fabrication like this.

However, a device described in Non-Patent Document 4 requires an SiN layer covering a fin FET body surface. This SiN layer complicates the fabrication process and the formation of the SiN layer generates, in the fin FET body, mechanical stress that tends to result in a leakage current. This is a disadvantage of the device.

A fin FET structure described in each of Patent Document 1 and Patent Document 2 has such a problem that a large area is required for each junction section of a source region section and a drain region section. Accordingly, junction parasitic capacitance of the fin FET is the same level as that of the conventional FET formed on the bulk Si. Thus, the fin FET structure has such a problem that reduction in size cannot be accompanied by reduction of the parasitic capacitance.

SUMMARY OF THE INVENTION

An object of the present invention is to provide a new fin FET structure formed on a bulk Si substrate and a fabrication process that overcomes problems and disadvantages of conventional fabrication methods.

In order to achieve the object mentioned above, an field effect transistor, according to the present invention, which is a metal-insulator-semiconductor field effect transistor having a fin section formed on a semiconductor substrate so as to protrude in a fin shape, including: a channel region section, a source region section, and a drain region section, which are formed at the fin section so that the channel region section is sandwiched by the source region section and the drain region section; the channel region being of the same conductivity type as the substrate, and physically and electrically in contact with the substrate; a gate dielectric thin film for coating the channel region section of the fin section; a gate electrode, insulated from the channel region section by the dielectric thin film, which is formed above the channel region section; and an insulating layer for covering a surface of the semiconductor substrate, wherein the fin section is formed so as to extend from the semiconductor substrate through the insulating layer and protrude outward from a surface of the insulating layer.

According to the arrangement, because the fin section is formed so as to extend from the semiconductor substrate through the insulating layer and protrude from the surface of the insulating layer, the fin section is made of a semiconductor material connected directly to the semiconductor substrate.

Accordingly, the arrangement can restrain destabilization of the transistor operation due to a floating body effect, in which a body potential of the channel region section floats apart from a fixed potential such as earth and the like.

In the arrangement, the fin section including the channel region section is provided so as to protrude in the fin shape. This makes it possible for the semiconductor material of the fin section to be fully depleted during an operating state of the transistor, even when the fin section is made finer for higher integration. As the result, the electric characteristic can be improved.

Moreover, the arrangement can omit the formation of the conventional SiN layer covering the surface of the channel region section by providing the insulating layer covering the semiconductor substrate. This can alleviate such a disadvantage that the SiN layer formed generates, within the channel region, mechanical stress that tends to result in a leakage current.

In order to achieve the object mentioned above, a field effect transistor fabrication method includes the steps of: providing active area islands adjacent to each other on a bulk semiconductor wafer substrate coated by a dielectric insulating section layer; forming an insulating layer on a surface of the bulk semiconductor wafer substrate by etching back the dielectric insulating section layer in a direction of thickness so as to form a field effect transistor body region protruding in a fin shape by uncovering each of the active area islands; forming a channel region section by doping the field effect transistor body region with impurity atoms adequate to define a threshold voltage of a transistor; forming a gate insulator film on the channel region section in accordance with deposition or thermal growth; forming a gate electrode by depositing and patterning an electrode material on the gate insulator film; and forming, subsequently, a source region section and a drain region section by doping the fin section, that is not covered by the gate electrode, with impurity atoms whose conductive polarity is opposite to a conductive polarity of the channel region section, with the gate electrode used as a self-aligned mask.

According to the fabrication method, (i) an insulating layer is formed by etching back the dielectric insulating section layer in a direction of thickness and (ii) a field effect transistor body region is formed so as to protrude in a fin shape by uncovering the fin section. As the result, the method can easily control the uncovered amount of the channel region section (that is, height of the channel region section). As the result, fabrication of a fin FET having a desired characteristic can be ensured.

For a fuller understanding of the nature and advantages of the invention, reference should be made to the ensuing detailed description taken in conjunction with the accompanying drawings.

DESCRIPTION OF THE EMBODIMENTS

Embodiments of a fin FET and a fabrication method thereof in the present invention are explained below, referring to FIG. 1 through FIG. 8. In the embodiments, an NMOS device is explained. However, it is obvious that a person with ordinary skill in the art, to which the present invention pertains, understands that the same is applicable for a PMOS device, which is complementary to the NMOS device, from the following explanation.

First Embodiment

Figure 1:
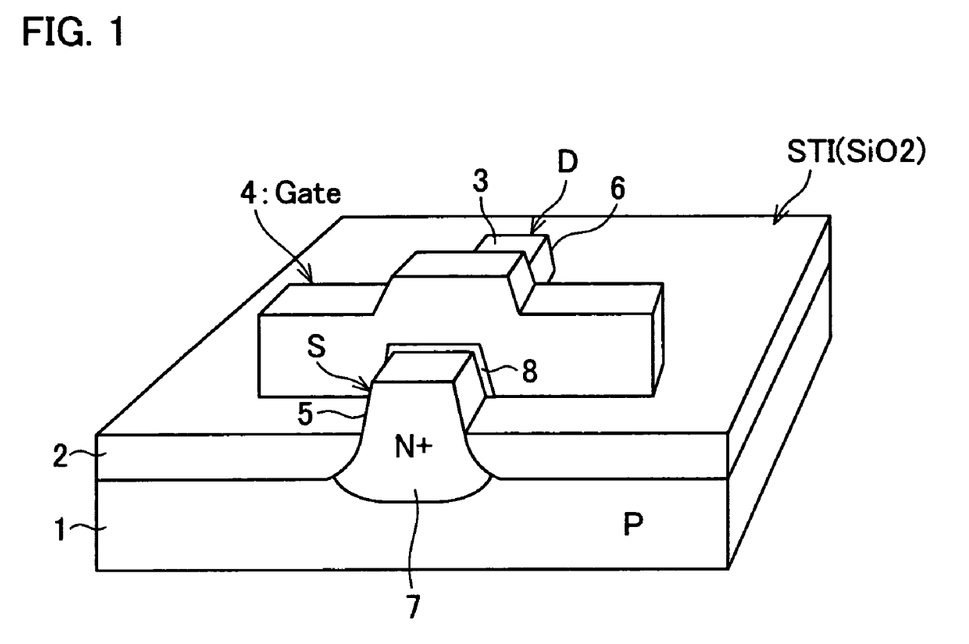
FIG. 1 is a perspective view illustrating a structure of a fin FET formed on a semiconductor substrate as a first embodiment of the present invention.
Figure 2:
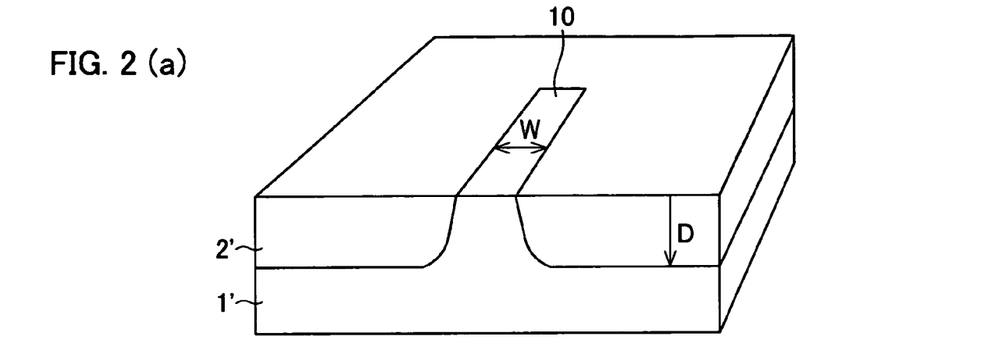
FIG. 2(a) through FIG. 2(d) are exploded perspective views of each process in an FET fabrication method of the first embodiment.

A fin FET in a first embodiment of the present invention, as illustrated in FIG. 1, is a metal-insulator-semiconductor FET including fin sections 3 and 5 on a semiconductor (ex. silicon) substrate 1. The semiconductor substrate 1 has P-type conductivity. The fin sections 3 and 5 are formed in a fin shape so as to protrude outward from a surface of the semiconductor substrate 1. Any material that can be used for a semiconductor device may be a material of the semiconductor substrate 1. Examples of such a material other than silicon are germanium, silicon-germanium and gallium arsenide. Moreover, the fin has a band shape in a horizontal cross section parallel to the surface of the semiconductor substrate 1 and also has a band shape in a vertical cross section perpendicular to the surface of the semiconductor substrate 1. Each of the band shapes may have constant width from one end to the other end in a longitudinal direction of the fin or may have varied width from one end to the other end; for example, the band shape may have a taper shape.

The fin sections 3 and 5 respectively serve as a source region section 5 and a drain region section 3 formed so as to sandwich a channel region section in a longitudinal direction. The source region section 5 and the drain region section 3 are made of material that has a different conductive type from that of the channel region section. For example, the source region section 5 and the drain region section 3 are made of an N+ type material. Moreover, a gate dielectric 8 is formed as a thin film coating the channel region. Furthermore, a gate electrode 4 insulated from the channel region section by the gate dielectric 8 is formed on the channel region section. The gate electrode 4 is formed in a band shape bridging over the channel region section. In other words, the gate electrode 4 is arranged so as to surround three sides of the channel region protruding outward; the sides including both side faces and a top surface of the channel region section.

In this embodiment, an insulating layer 2 covering the surface of the semiconductor substrate 1 is formed. Moreover, the fin sections 3 and 5 are formed so that the fin sections 3 and 5 extend outward from the semiconductor substrate 1 through the insulating layer 2 so as to protrude from the surface of the insulating layer 2. A preferable direction of the protrusion mentioned above is a direction perpendicular to the surface of the insulating layer 2.

In this manner, according to the arrangement, the fin sections 3 and 5 are formed so as to extend outward from the semiconductor substrate 1 through the insulating layer 2 so as to protrude from the surface of the insulating layer 2. Thus, the fin sections 3 and 5 are connected directly to the semiconductor substrate 1 and are made of the same material. Accordingly, it is possible to suppress destabilization of a transistor operation due to a floating body effect, in which a body potential of a channel region section floats apart from a fixed potential such as earth and the like of the fin sections 3 and 5.

In this arrangement, the fin sections 3 and 5 including the channel region section are formed in the protruding fin shape even when the fin sections 3 and 5 are made finer for higher integration. This arrangement also makes it possible for the semiconductor materials of the fin sections 3 and 5 to become fully-depleted during an operating state of a transistor. As the result, an electric characteristic in the FET of the present invention can be improved, compared with a conventional FET.

Moreover, in the arrangement, formation of a conventional SiN layer covering a surface of a channel region section can be omitted by providing the insulating layer 2 covering over the semiconductor substrate 1. This makes it possible to alleviate such a disadvantage that the SiN layer formed generates, within the channel region, mechanical stress that tends to result in a leakage current. Furthermore, by varying thickness of the insulating layer 2, fabrication of the fin FET that has intended height of the channel region section becomes possible. This can make adjustment of the FET characteristic easier.

In the first embodiment, preferable width of the fin sections 3 and 5 (channel region section) is at least equal to a height of the fin sections 3 and 5 protruding the surface of the insulating layer 2 and not more than twice the height of the fin sections 3 and 5 protruding from the surface of the insulating layer 2. Moreover, for higher integration, it is desirable that the channel region section of the fin sections 3 and 5 includes at least two plane faces, being substantially parallel to each other, each of which basically forms an angle of substantially 90° with respect to the surface of the semiconductor substrate 1.

The width is a length whose direction is orthogonal to the longitudinal direction of the fin sections 3 and 5 (that is, the direction in which the drain region section 3, the channel region section, and the source region section 5 are provided) and is also parallel to a surface direction of the semiconductor substrate. The height is a length whose direction is orthogonal to the longitudinal direction of the fin sections 3 and 5 and is orthogonal also to the surface direction of the semiconductor substrate.

With reference to FIG. 2(a) through FIG. 2(d), the fin FET on the bulk semiconductor wafer substrate and a fabrication method thereof is explained as the FET fabrication method of the first embodiment of the present invention. (Note that, although a plural number of FETs are formed at the same time, fabrication of a single FET is focused and explained in the explanation and the figures.)

First, as illustrated in the FIG. 2(a), an active area 10 (in practice, a plural number of areas 10) is formed by a standard CMOS process (photolithography and etching technique), so that, for example, the active area includes a top section (a top surface) having the width (W) so that the top section protrudes from a bulk semiconductor wafer substrate 1' in a fin shape. Then, a dielectric insulating section layer 2' such as an oxide film or the like is deposited on the bulk semiconductor wafer substrate 1' so as to form a single surface along with a surface of the top section of the active area 10. This defines the active area 10 embedded in the dielectric insulating section layer 2'. The embedding process of the active area 10 includes (a) Si etching, (b) oxidation, (c) filling with a CVD (Chemical Vapor Deposition) oxide and (d) planarization by Chemical Mechanical Polishing (CMP).

Next, as illustrated in FIG. 2(b), the dielectric insulating section layer 2' is etched back in a direction of thickness so as to define a Shallow Trench Isolation (STI). This uncovers the fin sections 3 and 5 from the Si active area 10 that had been embedded. The insulating layer 2 serving as the STI formed by the etching back insulates the fin sections 3 and 5 from adjacent fin sections 3 and 5, thereby defining the fin sections 3 and 5.

Ordinarily depth (D) of the dielectric insulating section layer 2' on the bulk semiconductor wafer substrate 1' is 300 nm to 500 nm from the original upper surface (the upper top surface) of the active area 10. The insulating section layer 2' is etched back so that a part of the active area 10 is uncovered. The remaining thickness of the insulating layer 2 is substantially 150 nm to 200 nm. Accordingly, the height (H) of the fin sections 3 and 5 uncovered are 150 nm to 300 nm. However, the height can be predeterminedly designed by adjusting an amount etched back.

Thereafter, the fin sections 3 and 5 constituting the channel region section of the FET are doped by ion implantation (Boron in the case of an NMOSFET). This process can determine a threshold voltage of the FET attained. Typically, doping of the channel region section is performed in order to obtain a doping concentration of $1\times10^{16}$ at/cm$^3$ to $1\times10^{18}$ at/cm$^3$. The width of the channel region section may be adjusted to the width of the gate electrode 4. Generally, the width is 10 nm to 300 nm.

Then, as illustrated in FIG. 2(c), the gate dielectric 8 is formed on the channel region section sandwiched by the fin sections 3 and 5 by thermal growth or deposition. An effective thickness of the gate dielectric (oxide) 8 ranges from 2 nm to 4 nm.

After the formation of the gate dielectric 8, deposition of the gate electrode material is performed on the insulating layer 2 and the fin sections 3 and 5, and a band-shaped gate electrode 4 is formed by patterning the gate electrode material. The gate electrode 4 may be formed by using CVD poly-silicon. After the formation of the gate electrode 4, the SiN layer (not illustrated) of substantially 3 nm in thickness is deposited on the gate electrode 4 so that the layer coats (conformally covers) the upper surface of the gate electrode 4 so as to provide insulation.

Then, it may be so arranged that: as illustrated in FIG. 2(d), a sidewall spacer is formed by deposition and etching back of a CVD oxide in order to offset an implant section 7 of the source region section 5 and an implant section 6 of the drain region section 3 from edges of the gate electrode 4 each of which is orthogonal to the longitudinal direction of the fin. It is preferable that each of the N+ implant sections 7 and 6 for the source region section 5 and the drain region section 3 is a combination of As ion and/or P ion which are implanted so as to have a substantially $1\times10^{20}$ at/cm$^3$ doping concentration.

Subsequently, the FET is completed by following a conventional process of Inter-Level-Dielectric (ILD) deposition, contact opening, and metallization for forming connection sections and interconnect sections to the FET. As the result, the fin FET of the embodiment can be attained.

In the fabrication method above, the FET is fabricated directly on the bulk semiconductor wafer substrate 1'. Thus, a junction section between (i) the fin sections 3 and 5 and (ii) the bulk semiconductor wafer substrate 1' is automatically defined. In other words, a body of the FET channel region section is jointed directly to the P-type bulk semiconductor wafer substrate 1'.

In this arrangement, a photolithography process defines the width of the active area 10. Accordingly, the FET having different channel region section width from other FET can be fabricated. When the height and the width of the fin sections 3 and 5 of the active area 10 are comparable lengths, a Tri-Gate fin FET, which includes the fin sections 3 and 5 jointed directly to the bulk semiconductor wafer substrate 1', can be attained.

Figure 3:
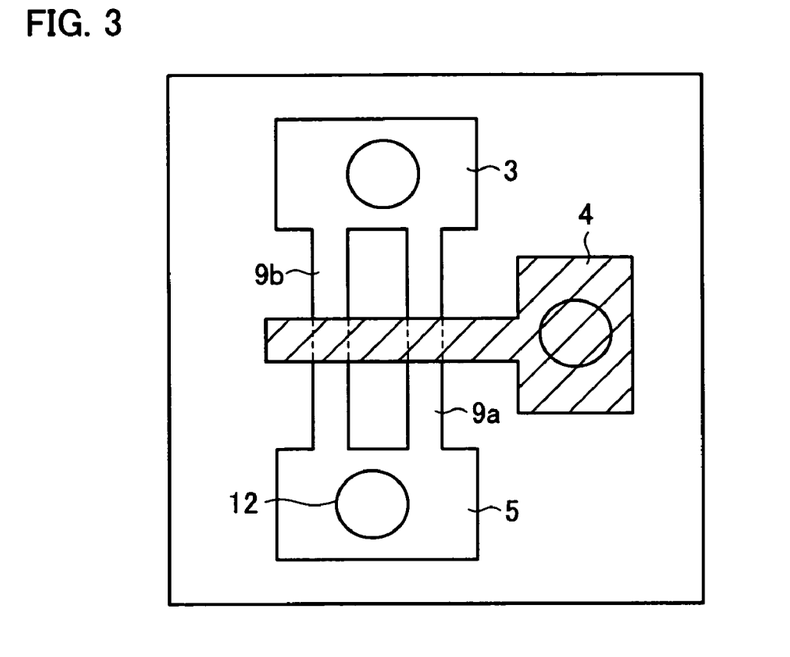
FIG. 3 is a plan view of a modification example of the FET in the first embodiment.
Figure 4:
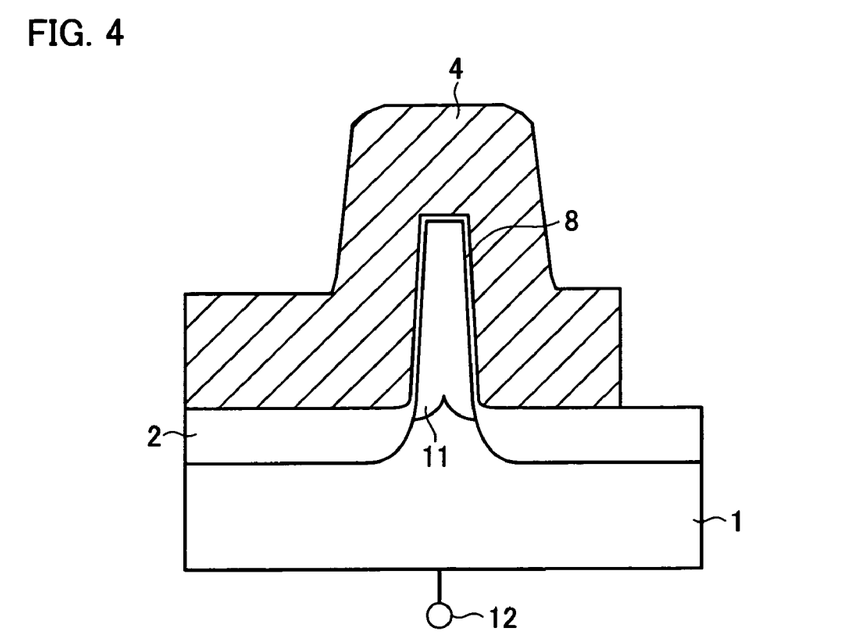
FIG. 4 is a sectional view of a substantial part of the modification example.

Next, one modification example of the first embodiment of the present invention is explained, referring to the FIG. 3 and FIG. 4. In this modification example, the fin sections 3 and 5, as illustrated in the FIG. 1, are in forms of two channel finger sections 9a and 9b dividing one channel into two in the width direction. The source region section 5 and the drain region section 3 may include contact sections 12. In the fin FET like this, the width of a channel region 11 (W illustrated in FIG. 2(a)) of each of the channel finger sections 9a and 9b can be provided narrowly as illustrated in FIG. 4. When the width is provided narrowly and the doping concentration is adjusted enough, application of potential to the gate electrode 4 can lead to a fully-depleted channel region 11.

Second Embodiment

Figure 5:
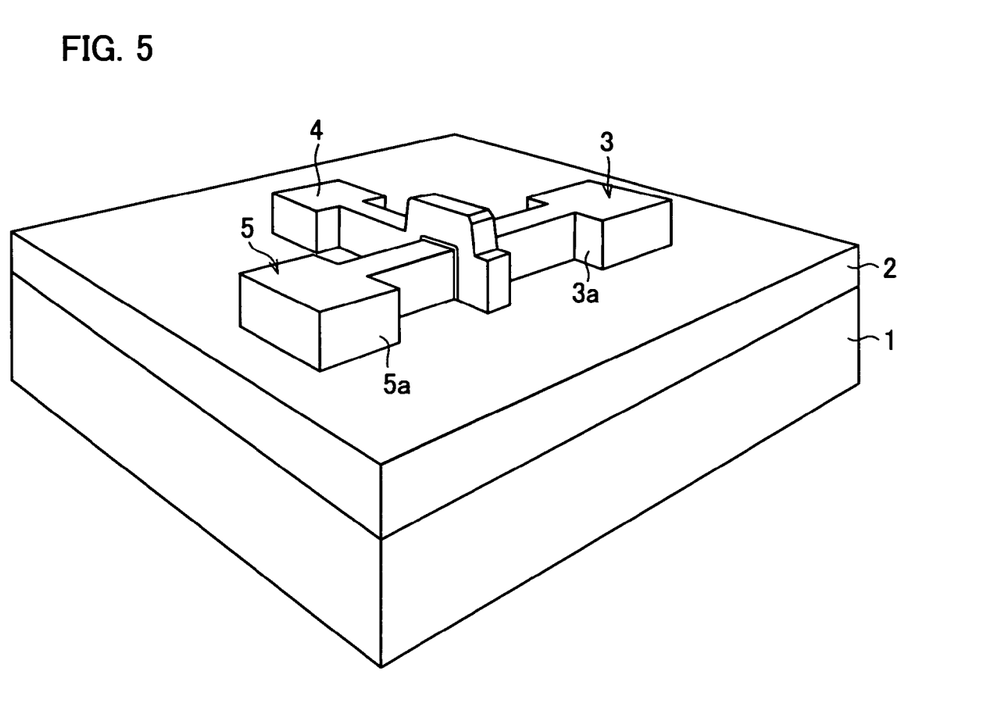
FIG. 5 is a perspective view illustrating a structure of a fin FET including a source region section and a drain region section, each of which extends upon an insulating layer on a bulk Si wafer substrate of an FET in a second embodiment of the present invention.
Figure 6:
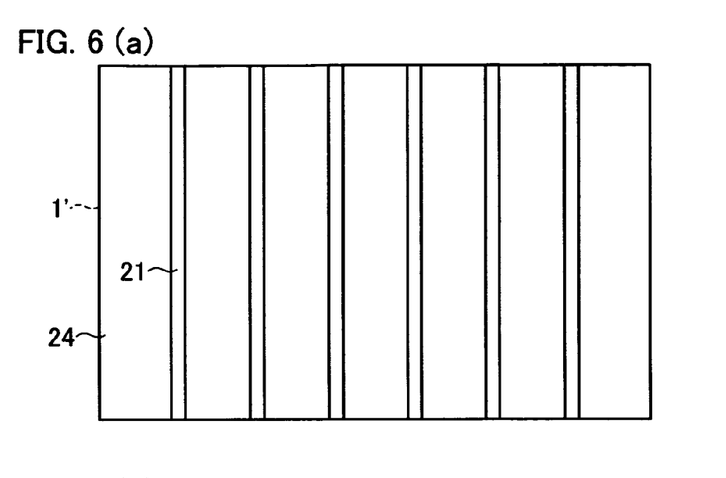
FIG. 6(a) through FIG. 6(c) are plan views of each process in an FET fabrication method of the second embodiment.
Figure 7:
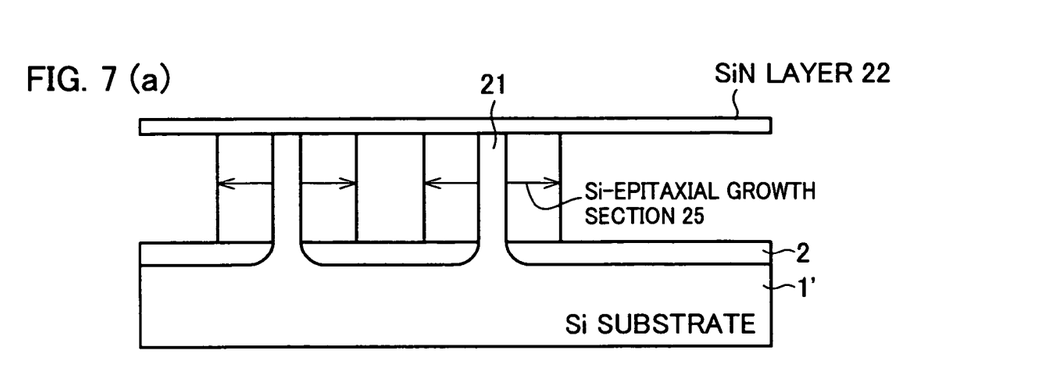
FIG. 7(a) is a cross sectional view taken along A-A of FIG. 6 (c).
FIG. 7(b) is a cross sectional view taken along B-B of FIG. 6 (c).
FIG. 7(c) is a cross sectional view taken along B-B after planarization of FIG. 7(b) by CMP treatment.
Figure 8:
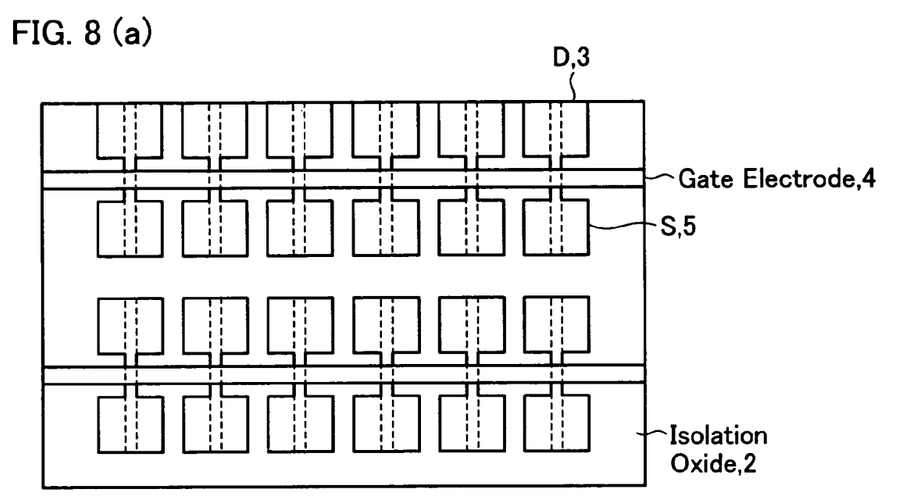
FIG. 8(a) is a plan view illustrating, by dotted lines, an initial fin pattern of the FET in the second embodiment.
FIG. 8(b) is a plan view illustrating a final transistor array of the FET in the second embodiment.

In a second embodiment of the present invention, as illustrated in FIG. 5, a source region section 5 and a drain region section 3 respectively have an extended source region section 5a and an extended drain region section 3a that are extended in a surface direction of the source region section 5 and the drain region section 3. A fabrication process of an FET of the second embodiment like this, as illustrated in FIG. 6(a) through FIG. 6(c) and FIG. 7(a) through FIG. 7(c), is explained below. This fabrication process of an FET is performed on a bulk semiconductor wafer substrate 1'. This FET fabrication technique is preferably applicable for formation of a transistor array, such as a gate array, a memory device or the like particularly. Moreover, the bulk semiconductor wafer substrate 1' is cut, according to need, at a final process so as to serve as the aforementioned semiconductor substrate 1.

The fabrication process starts with a method identical to the method for formation of fin sections 3 and 5 that constitute an Si protruding section of a fin FET explained in the first embodiment, as illustrated in FIG. 2(b). As illustrated in FIG. 6(a), in the case of a fin FET array, a plural number of fin sections 21 of band-shaped (striped shape) Si protruding sections, are formed so that the fin sections 21 are parallel to each other and have equal spaces between two adjacent fin sections.

After the formation of each fin section 21, for example, a CVD oxide layer 24 is deposited. The surface of the oxide layer 24 is planarized so as to correspond to the height of the Si fin sections 21 by CMP technique. This planarization is followed by deposition of an SiN layer 22 having thickness of 100 nm to 200 nm on the fin sections 21 and the oxide layer 24. This SiN layer is patterned by a photo-etching technique. This results in formation of a band-shaped SiN layer in a direction orthogonal to a longitudinal direction of the fin section 21. After the patterning, fin FET regions are coated by a photo-resist mask. Then, an uncovered part of the oxide layer 24 is removed by anisotropic etching. As the result, the oxide layer 24 remains as a dummy layer 23 only in a region covering each fin FET channel region section.

Next, silicon epitaxial growth (Si-epi) is carried out with respect to each fin section 21 by using $SiH_2$ gas for example. Because the SiN layer 22 serves as a "ceiling" layer, only lateral epitaxial growth is carried out below the SiN layer 22 and each epitaxial growth section 25 is formed.

This is illustrated in FIG. 7(a) which is a cross sectional view taken along A-A in FIG. 6(c). FIG. 7(b) illustrates the silicon epitaxial growth of the uncovered region (cross section taken along B-B).

After the silicon epitaxial growth, excessive silicon of the epitaxial growth sections 25 which protrudes outward from a top of the each fin section 21 is removed by applying CMP. After this planarization, the oxide dummy layer 23 and the SiN layer 22 are removed.

As the result of this process, as illustrated in FIG. 5, the source region section 5 and the drain region section 3 are respectively formed which have (i) minimal junction areas with the bulk semiconductor wafer substrate 1' and (ii) a source region extending section 5a and a drain region extending section 3a extending on an insulating layer 2.

This can make it easier to joint with an outside section because each contact section (where the FET is jointed with the outside section) of the source region section 5 and the drain region section 3 can be enlarged by forming the source region section 5 and the drain region section 3 extending on the insulating layer 2.

Moreover, this arrangement makes it possible (i) to form, on the insulating layer 2, most regions of the source region section 5 and the drain region section 3 and (ii) to reduce each junction area of the source region section 5 and the drain region section 3; the junction area in contact with the bulk semiconductor wafer substrate 1'. As the result: (a) parasitic (junction) capacitance can be kept small; (b) reduction of influence from the parasitic capacitance and the power dissipation can be ensured.

After the removal of the SiN layer 22, in the fabrication process of the present invention, deposition or thermal growth of a gate dielectric 8 and formation of a gate electrode 4 are performed. FIG. 8(a) and FIG. 8(b) illustrate a transistor array pattern using this technique. A similar technique as is explained in the first embodiment of the present invention can be used for the rest of FET fabrication processes.

The fin FET formation technique of the present invention can provide the effects set forth below.

(1) Because realization of a Double-Gate FET or a Tri-Gate FET on the bulk semiconductor wafer substrate 1' can be simplified, fabrication cost can be reduced.

(2) The fin FET, in which a fully depleted layer is formed in the bulk semiconductor wafer substrate 1' with bulk control, can be provided. As the result, a substantially ideal subthreshold slope can be obtained and then an OFF leakage current can be reduced. Accordingly, a low standby current LSI (Large Scale Integration) becomes possible.

(3) Because the junction area of the source region section 5 and the drain region section 3 can be reduced, the parasitic capacitance and the power dissipation are reduced. Accordingly, property deterioration caused by the parasitic capacitance can be avoided.

In order to achieve the object mentioned above, an field effect transistor, according to the present invention, which is a metal-insulator-semiconductor field effect transistor having a fin section formed on a semiconductor substrate so as to protrude in a fin shape, including: a channel region section, a source region section, and a drain region section, which are formed at the fin section so that the channel region section is sandwiched by the source region section and the drain region section; the channel region being of the same conductivity type as the substrate, and physically and electrically in contact with the substrate; a gate dielectric thin film for coating the channel region section of the fin section; a gate electrode, insulated from the channel region section by the dielectric thin film, which is formed above the channel region section; and an insulating layer for covering a surface of the semiconductor substrate, wherein the fin section is formed so as to extend from the semiconductor substrate through the insulating layer and protrude outward from a surface of the insulating layer.

According to the arrangement, because the fin section is formed so as to extend from the semiconductor substrate through the insulating layer and protrude from the surface of the insulating layer, the fin section is made of a semiconductor material connected directly to the semiconductor substrate. Accordingly, the arrangement can restrain destabilization of the transistor operation due to a floating body effect, in which a body potential of the channel region section floats apart from a fixed potential such as earth and the like.

In the arrangement, the fin section including the channel region section is provided so as to protrude in the fin shape. This makes it possible for the semiconductor material of the fin section to be fully depleted during an operating state of the transistor, even when the fin section is made finer for higher integration. As the result, the electric characteristic can be improved.

Moreover, the arrangement can omit the formation of the conventional SiN layer covering the surface of the channel region section by providing the insulating layer covering the semiconductor substrate. This can alleviate such a disadvantage that the SiN layer formed generates, within the channel region, mechanical stress that tends to result in a leakage current.

In the field effect transistor, it is preferable that a width of the channel region section is at least equal to a height of the fin section protruding from the surface of the insulating layer and is not more than twice the height of the fin section protruding from the surface of the insulating layer. In the field effect transistor, it is desirable that the channel region section includes at least two plane faces, being substantially parallel to each other, each of which basically forms an angle of substantially 90° with respect to the surface of the semiconductor substrate.

According to the arrangement, the channel region section includes at least two plane faces, being substantially parallel to each other, each of which basically forms an angle of substantially 90° with respect to the surface of the semiconductor substrate. Thus, the area occupied by the channel region section can be reduced and higher integration can be made easier.

In the field effect transistor, it is preferable that the gate electrode is formed so as to bridge over the channel region section. According to this arrangement, it becomes possible for the gate electrode to cover three sides (both side faces and a top surface) of the channel region section of the fin shape by forming the gate electrode so that the gate electrode bridges over the channel region section. By the gate electrode covering the three sides of the channel region section, fabrication of a Tri-Gate FET becomes possible. Accordingly, even when the fin section is made finer for higher integration, it is possible to attain higher performance: a current supplying ability is kept high.

In the field effect transistor, the source region section and the drain region section may be formed so as to extend on the insulating layer.

In the field effect transistor, it is desirable that each of the source region section and drain region section has an area, being in contact with the semiconductor substrate, which is smaller than an entire upper area of each of the source region section and the drain region section which upper area protrudes from the insulating layer.

According to the arrangement, the joint with each outside section can be made easier because each of contact sections of the source region section and the drain region section is broadened by forming each of the source region section and the drain region section so that these sections extend on the insulating layer.

Furthermore, the arrangement makes it possible to form large parts of the source region section and the drain region section on the insulating layer. Accordingly, each junction area of the source region section and the drain region section which are in contact with the semiconductor substrate can be made smaller. Thus, it is possible to keep the parasitic (junction) capacitor and dynamic power dissipation small.

The semiconductor substrate of the field effect transistor may be a silicon substrate. In the field effect transistor, it is preferable that the fin channel region protrudes from the surface of the insulating layer by a height of 100 nm to 500 nm. It is also preferable in the field effect transistor that a width of the channel region section is determined on the basis of a width of the gate electrode. Moreover, in the field effect transistor, it is desirable that a width of the channel region section of the fin section ranges from 10 nm to 300 nm. Further, in the field effect transistor, a thickness of the insulating layer ranges from 50 nm to 1000 nm.

A field effect transistor fabrication method, in order to achieve the object mentioned above, includes the steps of: providing active area islands adjacent to each other on a bulk semiconductor wafer substrate coated by a dielectric insulating section layer; forming an insulating layer on a surface of the bulk semiconductor wafer substrate by etching back the dielectric insulating section layer in a direction of thickness so as to form a field effect transistor body region protruding in a fin shape by uncovering each of the active area islands; forming a channel region section by doping the field effect transistor body region with impurity atoms adequate to define a threshold voltage of a transistor; forming a gate insulator film on the channel region section in accordance with deposition or thermal growth; forming a gate electrode by depositing and patterning an electrode material on the gate insulator film; and forming, subsequently, a source region section and a drain region section by doping the fin section, that is not covered by the gate electrode, with impurity atoms whose conductive polarity is opposite to a conductive polarity of the channel region section, with the gate electrode used as a self-aligned mask.

According to the fabrication method, (i) an insulating layer is formed by etching back the dielectric insulating section layer in a direction of thickness and (ii) a field effect transistor body region is formed so as to protrude in a fin shape by uncovering the fin section. As the result, the method allows the uncovered amount of the channel region section (that is, height of the channel region section) to be easily controlled. As the result, fabrication of a fin FET having a desired characteristic can be ensured.

In the fabrication method, the active area islands may be insulated from each other by forming a dielectric insulating section layer such as LOCOS (Localized Oxidation of Silicon), STI, a trench insulator section or the like, on the surface of the bulk semiconductor wafer substrate.

In the fabrication method, it is preferable that a width and a doping concentration of the channel region section of the fin section are adjusted so that the channel region section is entirely depleted due to an applied gate electrode voltage.

In the fabrication method, the fin section may be formed so as to protrude from the surface of the insulating layer by a height of 100 nm to 500 nm. In the fabrication method, a width of the channel region section of the fin section may range from 10 nm to 300 nm. Moreover, in the fabrication method, a thickness of the insulating layer formed by etching back the dielectric insulator section may range from 50 nm to 1000 nm so as to insulate the active area islands from each other.

In the fabrication method, the source region section and the drain region section may be formed as areas extending on the insulating layer; and each of the source region section and drain region section may have an area, being in contact with the semiconductor substrate, which is smaller than an entire upper area of each of the source region section and the drain region section which upper area protrudes from the insulating layer.

In the fabrication method, it is desirable that the extending areas of the source region section and the drain region section are formed in accordance with lateral silicon epitaxial growth.

INDUSTRIAL APPLICABILITY

An FET and its fabrication method of the present invention allows higher integration and restraint in property deterioration at lower production cost. Accordingly, the FET is applicable for use in electrical parts, for example, an integrated circuit memory device such as LSI and a transistor array.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:
1. A field effect transistor, which is a metal-insulator-semiconductor field effect transistor having a fin section formed on a semiconductor substrate so as to protrude in a fin shape, comprising:
   a channel region section, a source region section, and a drain region section, which are formed at the fin section so that the channel region section is sandwiched by the source region section and the drain region section;
      the channel region being of the same conductivity type as the substrate, and
   physically and electrically in contact with the substrate;
   a gate dielectric thin film for coating the channel region section of the fin section;
   a gate electrode, insulated from the channel region section by the dielectric thin film, which is formed above the channel region section; and
   an insulating layer for covering a surface of the semiconductor substrate, wherein
   said fin section is formed so as to extend from the semiconductor substrate through the insulating layer and protrude outward from a surface of the insulating layer and wherein the source region section and the drain region section extend outwardly from the semiconductor substrate, are formed at the fin section sandwiched by the insulating layer, extend through the insulating layer and protrude from the surface of the insulating layer, and wherein said source region section and said drain region section are formed so as to extend across a surface region of the insulating layer.
2. The field effect transistor as set forth in claim 1, wherein a width of the channel region section is at least equal to a height of the fin section protruding from the surface of the insulating layer and is not more than twice the height of the fin section protruding from the surface of the insulating layer.
3. The field effect transistor as set forth in claim 1, wherein said channel region section includes at least two plane faces, being parallel to each other, each of which basically forms an angle of substantially 90° with respect to the surface of the semiconductor substrate.
4. The field effect transistor as set forth in claim 1, wherein said gate electrode is formed so as to bridge over the channel region section.
5. The field effect transistor as set forth in claim 1, wherein:
   each of the source region section and drain region section has a lower area, being in contact with the semiconductor substrate and an upper area that continues into the lower area along a direction perpendicular to a surface of the semiconductor substrate;
   wherein the lower area has cross-section area that is smaller than a cross-section area of the upper area, the cross-section areas being parallel to the surface of the semiconductor substrate; and
   further wherein the upper area of each of the source region section and the drain region section which upper area protrudes from the insulating layer.
6. The field effect transistor as set forth in claim 1, wherein the semiconductor substrate is a silicon substrate.
7. The field effect transistor as set forth in claim 1, wherein said fin channel region protrudes from the surface of the insulating layer by a height of 100 nm to 500 nm.
8. The field effect transistor as set forth in claim 1, wherein a width of the channel region section is determined on the basis of a width of the gate electrode.
9. The field effect transistor as set forth in claim 1, wherein a width of the channel region section of the fin section ranges from 10 nm to 300 nm.
10. The field effect transistor as set forth in claim 1, wherein a thickness of the insulating layer ranges from 50 nm to 1000 nm.
11. The field effect transistor according to claim 1, wherein:
   the fin section is elongated along a longitudinal axis; and
   the source region section, the channel region section and the drain region section, are arranged sequentially along the longitudinal axis.
12. The field effect transistor according to claim 11, wherein:
   the gate electrode overlays the channel region section, the gate electrode being oriented in a direction generally perpendicular to the longitudinal axis.
13. The field effect transistor according to claim 12, wherein:
   the gate electrode overlays portions of an upper surface and first and second side surfaces of the channel region section.
14. The field effect transistor according to claim 1, wherein the source region and the drain region are offset from the edges of the gate electrode.
15. A MOS transistor comprising:
   a substrate of a semiconducting material of a first conductivity type;

a fin of the semiconductor material projecting from the substrate;

an insulating pattern formed on the substrate, wherein the insulating pattern surrounds and abuts a lower portion of the fin and further wherein an upper portion of the fin projects above a plane defined by an upper surface of the insulating pattern;

a source region, a channel region and a drain region sequentially arranged in a longitudinal direction along the fin, wherein the regions extend completely across the fin in a lateral direction, wherein the source region and the drain region extend into fin sections sandwiched by the insulating layer, and further wherein the source region and drain region are of a second conductivity type;

a gate dielectric film formed on the channel region; and a gate electrode pattern electrically insulated from the channel region by the dielectric film and extending completely across the fin in a lateral direction, wherein said source region section and said drain region section are formed so as to extend across a surface region of the insulating layer.

16. The MOS transistor according to claim 15, wherein:

the fin has a base width measured in a first plane corresponding to a surface of the substrate;

the fin has an intermediate width measured in a second plane corresponding to an exposed surface of the insulating pattern;

the fin has a top width measured in a third plane corresponding to an upper surface of the fin; and the fin hits a protrusion height measured in a direction normal to the second plane and between the second plane and the third plane, wherein the base width is greater than the intermediate width and the intermediate width is greater than or equal to the top width.

17. The MOS transistor according to claim 16, wherein:

the channel region has a length; and further wherein the protrusion height is less than or equal to the length of the channel region and the length of the channel region is less than or equal to twice the protrusion height of the fin.

18. The MOS transistor according to claim 15, wherein:

the lower region of the fin is continuous in the longitudinal direction.

19. The MOS transistor according to claim 16, wherein:

the lower region of the fin is continuous in the longitudinal direction.

20. The MOS transistor according to claim 16, wherein:

the channel region is characterized by a channel width where the channel width is greater than the top width.

21. The MOS transistor according to claim 16, wherein:

the channel region is characterized by a channel width where the channel width is greater than twice the top width.

22. The field effect transistor according to claim 15, wherein the source region and the drain region are offset from the edges of the gate electrode.

* * * * *